(12) United States Patent
Yamada et al.

(10) Patent No.: US 7,196,496 B2
(45) Date of Patent: Mar. 27, 2007

(54) BATTERY CONTROL CIRCUIT AND ELECTRONIC DEVICE

(75) Inventors: Susumu Yamada, Gunma (JP); Tsunehiko Yatsu, Gunma (JP)

(73) Assignee: Sanyo Electric Co., Ltd, Osaka (JP)

( * ) Notice: Subject to any disclaimer, the term of this patent is extended or adjusted under 35 U.S.C. 154(b) by 295 days.

(21) Appl. No.: 10/696,715

(22) Filed: Oct. 29, 2003

(65) Prior Publication Data

US 2005/0046392 A1 Mar. 3, 2005

(51) Int. Cl.
*H02J 7/04* (2006.01)
*H02J 7/16* (2006.01)
*H02J 7/00* (2006.01)

(52) U.S. Cl. .................. 320/149; 320/136; 320/150

(58) Field of Classification Search ............. 320/149, 320/132, 134, 136, 150
See application file for complete search history.

(56) References Cited

U.S. PATENT DOCUMENTS 5,912,544 A * 6/1999 Miyakawa et al. ......... 320/106
6,037,778 A * 3/2000 Makhija .................. 324/433
6,134,391 A * 10/2000 Takahashi ................ 396/277

FOREIGN PATENT DOCUMENTS

JP          2000-350371         12/2000

* cited by examiner

*Primary Examiner*—David Gray
*Assistant Examiner*—Yalkew Fantu
(74) *Attorney, Agent, or Firm*—SoCal IP Law Group LLP; Steven C. Sereboff

(57) ABSTRACT

A battery control circuit having a battery voltage detecting section for detecting the voltage of a battery includes a resistor and a switching element which are connected in series and which are connected to the battery in parallel, and a battery controlling section for acquiring information relating to a change in the voltage of the battery, which is detected by the battery voltage detecting section, by turning on the switching element to allow a current of the battery to flow through the resistor. The battery controlling section determines the residual capacity of the battery based on the information relating to the change in the voltage of the battery.

10 Claims, 5 Drawing Sheets

BATTERY CONTROL CIRCUIT

BATTERY CONTROL CIRCUIT

BATTERY CONTROL CIRCUIT AND ELECTRONIC DEVICE

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by any one of the patent disclosure as it appears in the Patent and Trademark Office patent files or records, but otherwise reserves all copyright and trade dress rights whatsoever.

RELATED APPLICATION INFORMATION

The present application claims priority upon Japanese Patent Application No. 2002-316482 filed on Oct. 29, 2002, which is herein incorporated by reference.

BACKGROUND OF THE INVENTION

1. Field of the Invention

The present invention relates to a battery control circuit and an electronic device.

2. Description of Related Art

Portable electronic devices can include batteries (battery packs) for supplying operating power to device bodies. Such portable electronic devices are, for example, digital still cameras, video cameras, cellular phones, personal digital assistants (PDAs), and the like.

Into such a portable electronic device, a battery level detector for detecting the residual capacity of a battery is incorporated. In a method for detecting the residual capacity by the battery level detector, as shown in a block diagram of a battery control circuit of FIG. 5, voltage-dividing resistors R1 and R2 connected in series are connected to a battery 10 in parallel. The voltage appearing at the connection point between the voltage-dividing resistors R1 and R2 is detected by a microcomputer 20 (hereinafter referred to as "MC"). This MC 20 handles the detected voltage as information reflecting the residual capacity of the battery 10. Further, the MC 20 is constituted of a battery residual capacity detection LSI which has a built-in AD converter and to which an AD input terminal is added, and estimates the battery residual capacity based on the detected voltage (e.g., refer to Japanese Patent Application Laid-open Publication No. 2000-350371 (FIG. 9)). The battery residual capacity is displayed by, for example, a display device of the device body.

However, in the aforementioned conventional art, the voltage appearing at the connection point between the voltage-dividing resistors R1 and R2 is merely detected as information reflecting the residual capacity of the battery 10. The voltage detected in this way is not sufficient by itself to correctly estimate the actual residual capacity of the battery 10, which has a type-dependent difference and an individual difference.

Accordingly, in order to accurately estimate the residual capacity of the battery 10, for example, an advanced battery control function is employed in a notebook computer system. However, a system for realizing the advanced battery control function has a very complex configuration, and therefore cannot be employed in portable electronic devices and the like in which miniaturization and price reduction are required.

SUMMARY OF THE INVENTION

One aspect of the present invention provides a battery control circuit having a battery voltage detecting section for detecting a voltage of a battery which comprises a resistor and a switching element which are connected in series and which are connected to the battery in parallel, and a battery controlling section for acquiring information relating to a change in the voltage of the battery by turning on the switching element to allow a current of the battery to flow through the resistor, the voltage being detected by the battery voltage detecting section. Here, the battery controlling section determines the residual capacity of the battery based on the information relating to the change in the voltage of the battery.

Features and objects of the present invention other than the above will become clear by reading the description of the present specification with reference to the accompanying drawings.

DESCRIPTION OF THE DRAWINGS

For a more complete understanding of the present invention and the advantages thereof, reference is now made to the following description taken in conjunction with the accompanying drawings wherein.

DETAILED DESCRIPTION OF THE INVENTION

At least the following matters will be made clear by the description in the present specification and the description of the accompanying drawings.

In a battery control circuit according to the present embodiment, the following can be adopted.

The battery voltage detecting section includes first and second voltage-dividing resistors connected in series. The first and second voltage-dividing resistors are connected to the battery in parallel. The voltage at the connection point between the first and second voltage-dividing resistors is detected as the voltage of the battery.

Moreover, the change amount of the voltage of the battery, which is detected by the battery voltage detecting section when the switching element is turned on, is set as the information relating to the change in the voltage of the battery.

Further, with respect to the voltage of the battery which is detected by the battery control circuit in the state where the switching element is ON, the battery control circuit includes a voltage recovery time measuring section to measure the time period from the time when the switching element is turned off to the time when the voltage of the battery recovers to a predetermined value. The time period measured by the voltage recovery time measuring section is set as the information relating to the change in the voltage of the battery.

Furthermore, the battery control circuit includes a section for storing characteristics information relating to the residual capacity of the battery. The battery voltage detecting section refers to the characteristics information in the storing section to determine the residual capacity of the battery based on the information relating to the change in the voltage of the battery.

An electronic device in the present embodiment includes the above-described battery control circuit, and is supplied with operating power from the battery.

In addition, a component consuming the power based on the operating power can be formed with the resistors.

Figure 1:
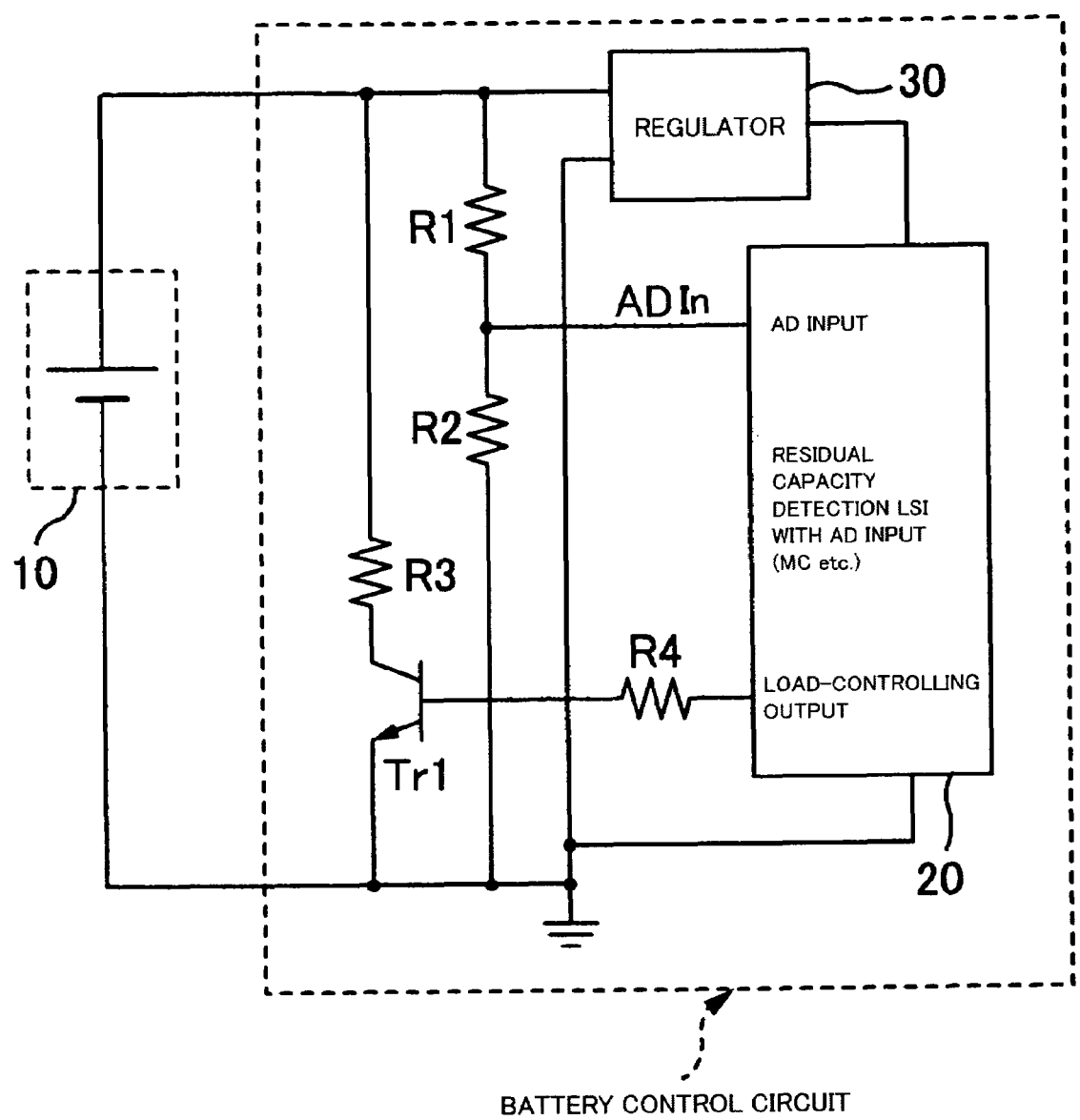
FIG. 1 is a block diagram of a battery control circuit according to embodiments of the present invention.
Figure 5:
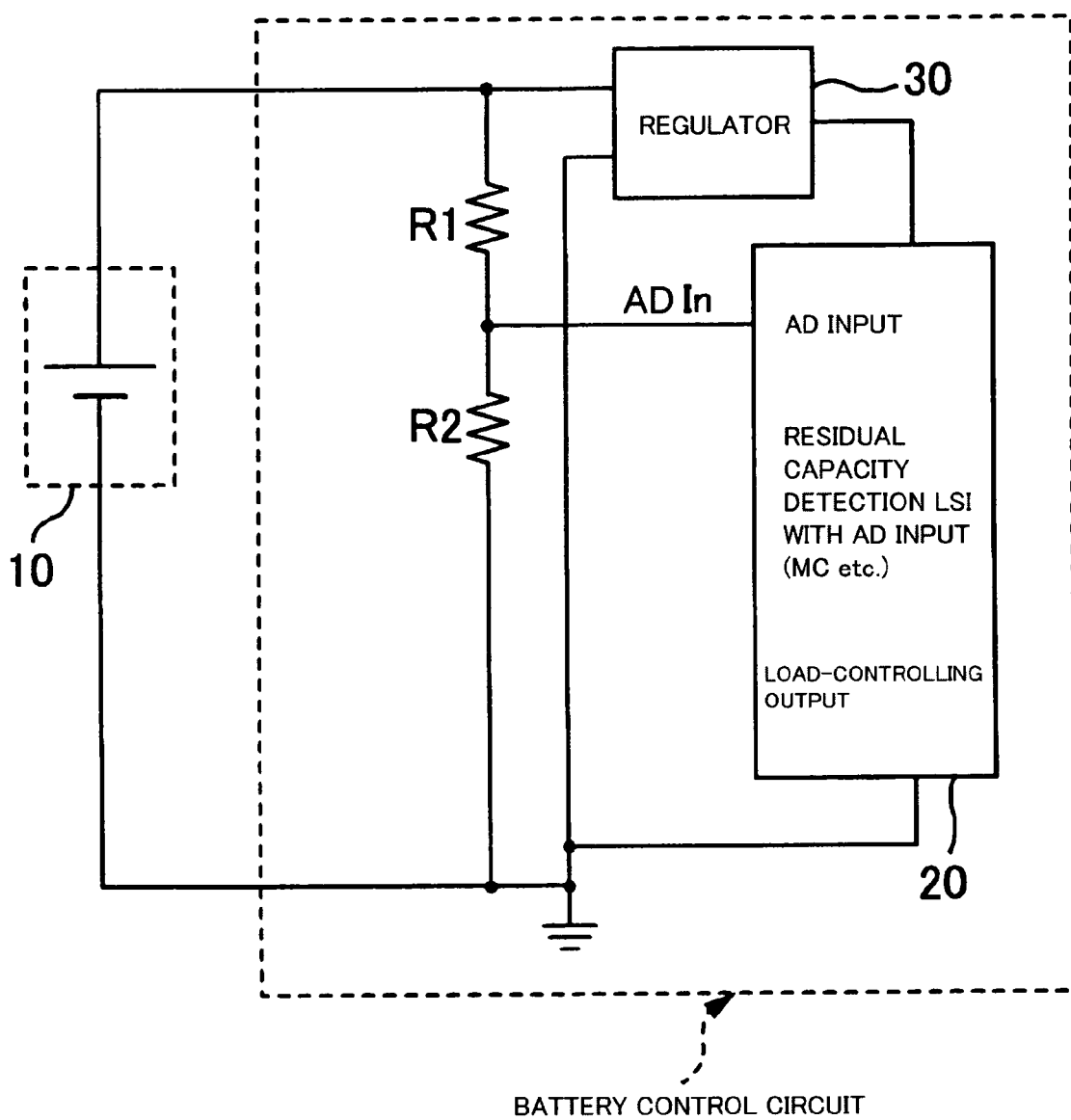
FIG. 5 is a block diagram of a conventional battery control circuit.

In the present embodiment, as shown in FIG. 1, a resistor R3 as a pseudo load for allowing a current to flow from a battery 10, a switching element (switching transistor) Tr1 and a resistor R4 are added to the battery control ciruit of FIG. 5 which is taken as a conventional art. Specifically, the resistor R3 and the switching element Tr1 connected in series are connected to the battery 10 in parallel in a configuration where the plurality of voltage-dividing resistors R1 and R2 (battery voltage detecting section, first and second voltage-dividing resistors) connected in series are connected to the battery 10 in parallel.

Moreover, a microcomputer (battery controlling section) 20 is constituted by a battery residual capacity detection LSI which has a built-in AD converter and a built-in counter (voltage recovery time measuring section). Further, the operating power of the microcomputer 20 is supplied through a regulator (power-supply unit) 30 connected to the battery 10.

Figure 2:
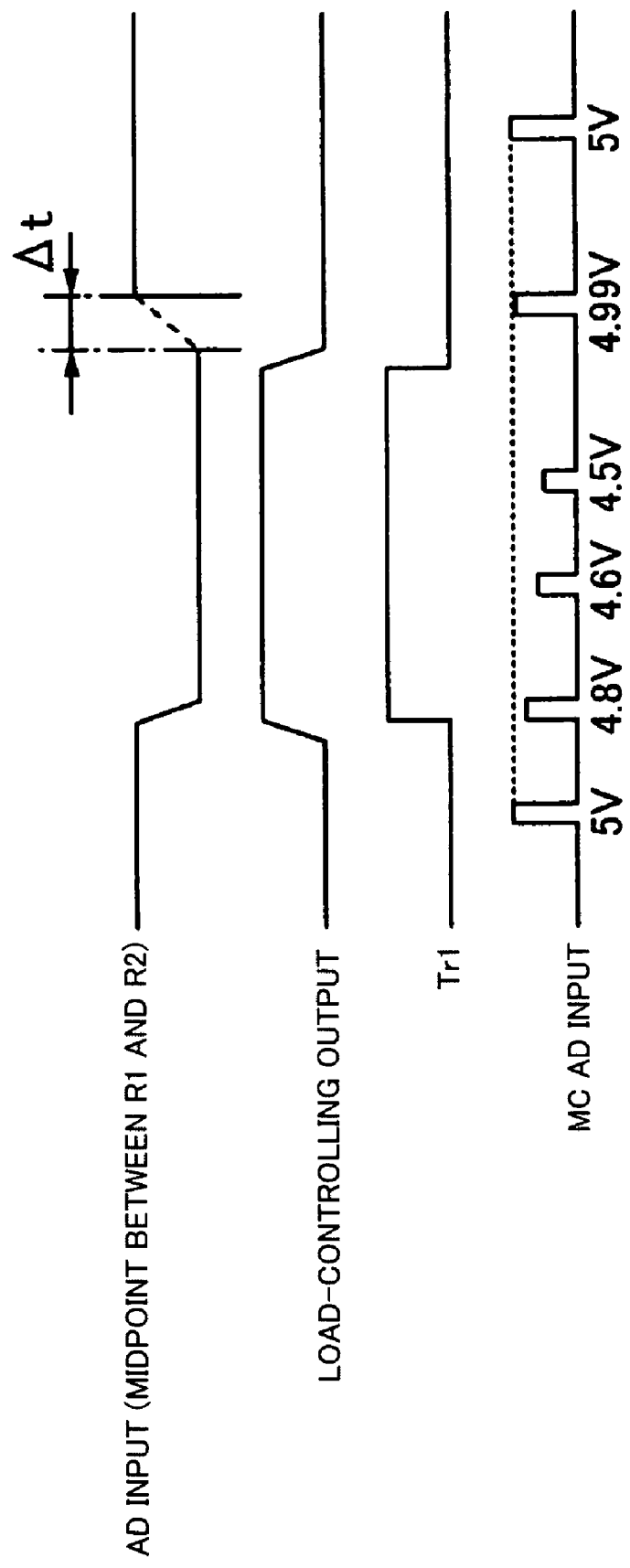
FIG. 2 is a conceptual timing chart showing the operation of the battery control circuit according to the embodiments of the present invention.

Furthermore, as shown in FIG. 1 and a conceptual timing chart of FIG. 2, the programmable microcomputer (battery controlling section, hereinafter referred to as "MC") 20 applies a voltage as load-controlling output through the resistor R4 to turn on and off the switching element Tr1. As shown in FIG. 2, when the MC 20 applies, for example, a voltage of 1 V or higher as the load-controlling output, the status of the switching element Tr1 changes from OFF to ON. When the switching element Tr1 is turned on, a current flows from the battery 10 to the resistor R3 and the switching element Tr1. This changes the voltage "AD In" (hereinafter referred to as "detected battery voltage") detected at the connection point between the voltage-dividing resistors R1 and R2. The MC 20 acquires information (hereinafter referred to as "voltage change information") relating to this change through an AD input terminal (in FIG. 2, the graph of "MC AD input"). Then, based on the acquired voltage change information, the MC 20 refers to a battery residual capacity characteristic table (battery residual capacity characteristics information) stored on a programmable ROM (storing section, hereinafter referred to as "ROM") or the like in the MC 20 to determine the residual capacity of the battery 10. The determined battery residual capacity is, for example, displayed with a display device of the device body.

With respect to the voltage change information, for example, two types of information can be cited. One type of information is the change amount of the detected battery voltage when the switching element Tr1 is turned on. This is a first embodiment to be described later. The other type of information is the time period (hereinafter referred to as "voltage recovery time") from the time when the switching element Tr1 is turned off to the time when the detected battery voltage, which is detected in the state where the switching element Tr1 is ON, recovers to a predetermined voltage value. This is a second embodiment to be described later. The voltage recovery time is measured with the counter in the MC 20 which acquires the detected battery voltage.

Note that any voltage reflecting the voltage of the battery can be the detected battery voltage, and that the detected battery voltage is not limited to the voltage detected at the connection point between the voltage-dividing resistors R1 and R2.

First Embodiment

The aforementioned case where the voltage change information is the change amount of the detected battery voltage will be described. As shown in the graph of "MC AD input" of FIG. 2 described previously, the MC 20 acquires the voltage change information in a cycle based on a clock frequency for sampling. When the switching element Tr1 is OFF, the detected battery voltage is approximately 5 V. On the other hand, when the switching element Tr1 is turned on, the detected battery voltage decreases and varies around the values of 4.8 V, 4.6 V and 4.5 V. Based on these decreased values of the detected battery voltage, the battery residual capacity characteristics table stored on the ROM in the MC 20 is referred to, and the residual capacity of the battery 10 is determined.

Figure 3:
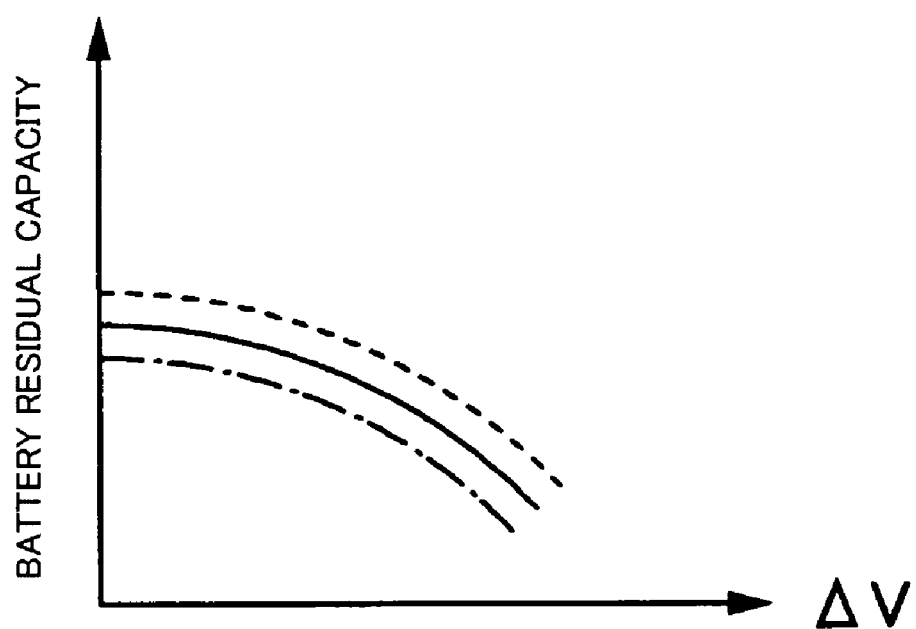
FIG. 3 is a view showing a characteristics table of a battery residual capacity to a change amount of a battery voltage detected by the battery control circuit according to the embodiments of the present invention.

The battery residual capacity characteristics table is a numerical data set corresponding to the graph shown in FIG. 3. In the graph (solid line) shown in FIG. 3, the change amount (in this drawing, "$\Delta V$") of the detected battery voltage is on the horizontal axis using 5 V as a reference which is the voltage when the switching element Tr1 is OFF, and the battery residual capacity is on the vertical axis. That is, when the detected battery voltage is 4.8 V, the change amount (absolute value) of the detected battery voltage is 0.2 V; when the detected battery voltage is 4.6 V, the change amount is 0.4 V; and when the detected battery voltage is 4.5 V, the change amount is 0.5 V. Although the battery residual capacity is determined according to the change amount of the detected battery voltage as shown in the graph of FIG. 3, battery residual capacity characteristics tables corresponding to graphs (broken line and dashed dotted line) which are made in accordance with different temperatures are prepared in advance in order to compensate for the change in temperature.

Incidentally, to cite other examples of the change amount of the detected battery voltage, not only the above-described difference based on 5 V but also various types of information relating to the change amount such as the difference of the above-described difference and the first differential coefficient of the detected battery voltage can be utilized.

Second Embodiment

The aforementioned case where the voltage change information is the voltage recovery time will be described. As shown in the graph of "MC AD input" of FIG. 2 described previously, the MC 20 acquires the voltage change information. When the switching element Tr1 is OFF, the detected battery voltage is approximately 5 V. On the other hand, when the switching element Tr1 is turned on, the detected battery voltage decreases and varies around the values of 4.8 V, 4.6 V and 4.5 V. As described previously, the time period from the time when the status of the switching element changes from ON to OFF to the time when the decreased detected battery voltage recovers to the original voltage of approximately 5 V (e.g., a voltage equivalent to 95% of 5 V) is set as the voltage recovery time. As shown in the graph of "AD input" of FIG. 2, the time period (in this drawing, "Δt") corresponding to the part of the graph represented by a broken line is the voltage recovery time. The voltage recovery time can be counted with the number of times of sampling the detected battery voltage.

Incidentally, in the graph of "MC AD input" of FIG. 2, for convenience of description, the sampling intervals of the detected battery voltage are long, and the number of times of sampling is small. However, in practice, since the sampling intervals are short, the number of times of sampling is large enough to measure the voltage recovery time. Based on the measured voltage recovery time, the battery residual capacity characteristics table stored on the ROM in the MC 20 is referred to, thus the residual capacity of the battery 10 is determined.

Figure 4:
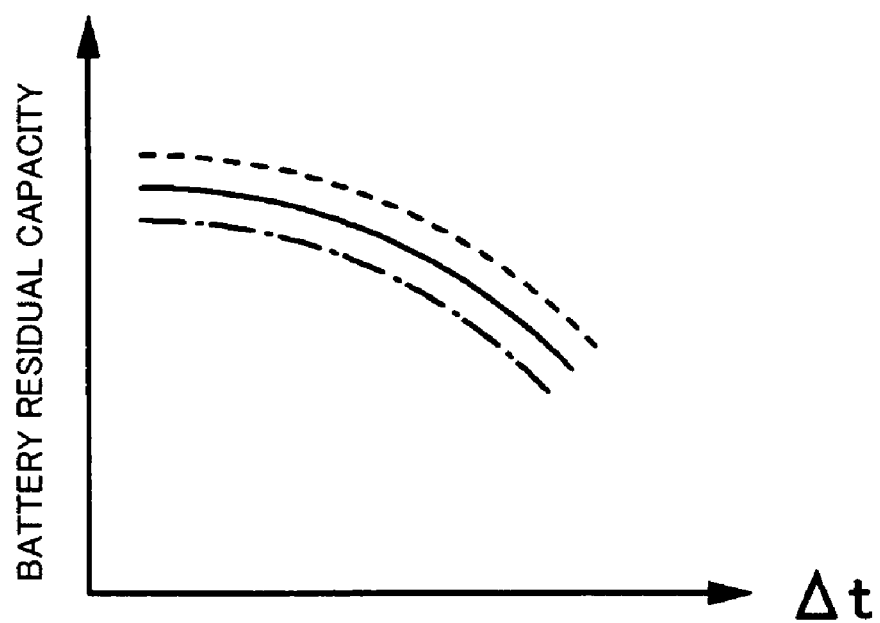
FIG. 4 is a view showing a characteristics table of the battery residual capacity to a recovery time of the battery voltage measured by the battery control circuit according to the embodiments of the present invention.

The battery residual capacity characteristics table is a numerical data set corresponding to the graph (solid line) shown in FIG. 4. In the graph shown in FIG. 4, the voltage recovery time is on the horizontal axis, and the battery residual capacity is on the vertical axis. Specifically, as shown in the graph of FIG. 4, although the battery residual capacity is determined according to the measured voltage recovery time, battery residual capacity characteristics tables corresponding to graphs (broken line and dashed dotted line) which are made in accordance with different temperatures are prepared in advance in order to compensate for the change in temperature.

Other Embodiments

In FIG. 1, the value of resistance of the resistor R3 as a pseudo load may be made variable. In this case, the current flowing from the battery 10 to the resistor R3 is changed as needed, thereby the voltage change information may be acquired. Specifically, battery residual capacity characteristics tables corresponding to the respective values of the variable resistor R3 is prepared in advance, and the resistor R3 is changed as needed to acquire the voltage change information. This makes it possible to determine the battery residual capacity with higher accuracy. To cite an example of a mechanism for changing the value of resistance of the resistor R3, two pairs each having the resistor R3 and the switching element Tr1 connected in series are prepared, and these two pairs are connected to the battery 10 in parallel. In this case, the MC 20 uses two output terminals in order to turn on and off the two switching elements individually.

Moreover, miniaturization and the reduction in the number of assembly steps can be achieved by including as many components in the MC 20 as possible. Specifically, as shown in FIG. 1, the resistors R1, R2, and R4 and the switching element Tr1 can be included in the MC 20. Thus, only the resistor R3 as a pseudo load is an external component, and the value of resistance thereof can be set appropriately.

Further, the resistor R3 which has been a pseudo load can be an actually operating load. Specifically, the aforementioned battery control circuit of the present embodiment is incorporated into a portable electronic device, and the battery (battery pack) 10 for supplying operating power to the device body is determined as a control object. That is, any part or the whole (components) of the device body supplied with the operating power is handled as the resistor R3 having a load. This eliminates the necessity of providing the resistor R3 dedicated only for a pseudo load and reduces the number of components. As an electronic device into which the battery control circuit is incorporated, for example, a digital still camera, a video camera, a cellular phone, a personal digital assistant (PDA), and the like can be cited. In this case, what can be the resistor R3 is a motor used for a focus or zoom adjustment mechanism or a rechargeable battery for a flash in a digital still camera or a video camera.

Furthermore, since the battery 10 has a type-dependent difference and an individual difference, a battery residual capacity characteristics table specific to the battery is held on the battery 10 side. This makes it possible to determine a more accurate residual capacity. Specifically, the MC 20 reads the battery residual capacity characteristic table from the battery 10 attached thereto, as needed, and then determines the battery residual capacity similarly to the aforementioned embodiment. To cite an example of a mechanism for holding the battery residual capacity characteristics table on the battery 10 side, an appropriate storage medium or storage element, such as a ROM, is incorporated into the battery pack in advance.

The present embodiments have the following effects. The residual capacity of a battery can be accurately estimated with a simple configuration.

Specifically, when the voltage of the battery is detected in order to determine the residual capacity, a microcomputer acquires the voltage of the battery from the same detection point as that of the aforementioned conventional art. That is, the residual capacity of the battery can be accurately estimated only by adding a simple configuration in which the resistor R3, the switching element Tr1, and the like are provided. Further, the simple configuration leads to a low cost.

Moreover, since characteristic data of various types of batteries can be stored in the microcomputer, the residual capacity can be estimated depending on the various types of batteries.

Although the preferred embodiments of the present invention have been described in detail, it should be understood that various changes, substitutions, and alterations can be made therein without departing from spirit and scope of the invention as defined by the appended claims.

The invention claimed is:

1. A battery control circuit comprising:
   a battery voltage detecting section for detecting a voltage of a battery
   a resistor and a switching element connected in series being connected to said battery in parallel; and
   a battery controlling section for acquiring information relating to a change between the voltage of said battery detected by said battery voltage detecting section when said switching element is ON and the voltage of said battery detected by said battery voltage detecting section when said switching element is OFF by turning on said switching element to allow a current of said battery to flow through said resistor and by turning off said switching element; and
   a voltage recovery time measurement section for measuring a time period from a time when said switching element is turned off to a time when the voltage of the battery detected by said battery voltage detecting section recovers to a predetermined voltage value,
   wherein said battery controlling section determines a residual capacity of said battery based on the information relating to the change in the voltage of said battery, and
   wherein the information relating to the change is said time period measured by said voltage recovery time measurement section.

2. The battery control circuit according to claim 1, wherein said battery voltage detecting section comprises first and second voltage-dividing resistors connected in series, and said first and second voltage-dividing resistors are connected to said resistor and said switching element in parallel, and a voltage at a connection point between said first and said second voltage-dividing resistors is detected as the voltage of said battery.

3. The battery control circuit according to claim 1,
wherein the information relating to the change is a change amount between the voltage of said battery detected by said battery voltage detecting section when said switching element is OFF and the voltage of said battery detected by said battery voltage detecting section when said switching element is ON.

4. The battery control circuit according to claim 1, further comprising:
   a storing section for storing characteristics information of relation between the information relating to the change and said residual capacity of said battery,
   wherein said battery controlling section refers to said characteristic information in said storing section to determine the residual capacity of said battery based on the information relating to the change.

5. The battery control circuit according to claim 2,
wherein the information relating to the change is a change amount between the voltage of said battery detected by said battery voltage detecting section when said switching element is OFF and the voltage of said battery detected by said battery voltage detecting section when said switching element is ON.

6. The battery control circuit according to claim 2, further comprising:
   a storing section for storing characteristic information of relation between the information relating to the change and said residual capacity of said battery,
   wherein said battery controlling section refers to said characteristic information in said storing section to determine the residual capacity of said battery based on the information relating to the change.

7. The battery control circuit according to claim 3, further comprising:
   a storing section for storing characteristic information of relation between the change amount and said residual capacity of said battery,
   wherein said battery controlling section refers to said characteristic information in said storing section to determine the residual capacity of said battery based on the information relating to the change.

8. The battery control circuit according to claim 5, further comprising:
   a storing section for storing characteristic information of relation between the information relating to the change and said residual capacity of said battery,
   wherein said battery controlling section refers to said characteristic information in said storing section to determine the residual capacity of said battery based on the information relating to the change.

9. An electronic device comprising:
   the battery control circuit according to any one of claims 1, 2, 3, 4, 5, 6, 7, and 8,
   wherein operating power is supplied from said battery.

10. The electronic device according to claim 9, wherein said resistor is an actually operating load of the electronic device.

* * * * *